US009811121B2

(12) United States Patent
Cardinali et al.

(10) Patent No.: US 9,811,121 B2
(45) Date of Patent: Nov. 7, 2017

(54) LIQUID-RESISTANT ACOUSTIC DEVICE GASKET AND MEMBRANE ASSEMBLIES (71) Applicant: Apple Inc., Cupertino, CA (US)

(72) Inventors: Steven P. Cardinali, Cupertino, CA (US); Anna-Katrina Shedletsky, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 44 days.

(21) Appl. No.: 14/747,642

(22) Filed: Jun. 23, 2015

(65) Prior Publication Data
US 2016/0378142 A1 Dec. 29, 2016

(51) Int. Cl.
G06F 1/16 (2006.01)
H04R 1/08 (2006.01)
H04R 1/00 (2006.01)
H04R 7/00 (2006.01)
B81B 7/00 (2006.01)
G06F 15/02 (2006.01)

(52) U.S. Cl.
CPC ............. *G06F 1/1656* (2013.01); *H04R 1/00* (2013.01); *H04R 1/086* (2013.01); *H04R 7/00* (2013.01); *B81B 7/0009* (2013.01); *B81B 2207/11* (2013.01); *G06F 15/0208* (2013.01)

(58) Field of Classification Search
CPC ... G06F 15/0208; G06F 1/1656; H04R 1/086; B81B 2207/11; B81B 7/0009
USPC .......................................................... 381/189
See application file for complete search history.

(56) References Cited

U.S. PATENT DOCUMENTS 3,987,258 A 10/1976 Tsutsui
4,920,564 A * 4/1990 Allkins .................. H04M 1/03
181/242

(Continued)

FOREIGN PATENT DOCUMENTS

CN 1642355 7/2005
CN 1933679 3/2007

(Continued)

OTHER PUBLICATIONS

Nakano et al., "Helmholtz resonance technique for measuring liquid volumes under micro-gravity conditions," Microgravity Sci. Technol., XVII-3, 2005, pp. 64-70.

(Continued)

*Primary Examiner* — Davetta W Goins
*Assistant Examiner* — Oyesola C Ojo
(74) *Attorney, Agent, or Firm* — Kendall W. Abbasi (57) ABSTRACT A liquid-resistant acoustic assembly for an electronic device includes an acoustic device positioned in a housing, a gasket compressed between the acoustic device and the housing, and a liquid-resistant membrane. The liquid-resistant membrane is disposed such that it is isolated from a non-uniform compressive distribution resulting from compression of the gasket. The liquid-resistant membrane may be uncompressed by compression of the gasket or compressed by a different compressive force than the gasket. For example, the liquid-resistant membrane may not be positioned between the gasket and the acoustic device, may be separated from the gasket, may be mounted to a shelf of the gasket or within a gap defined by the gasket, mounted to a stiffener positioned within the gasket, and mounted using other similar configurations.

20 Claims, 7 Drawing Sheets

(56) References Cited

U.S. PATENT DOCUMENTS

| | | | |
|---|---|---|---|
| 5,349,140 A | 9/1994 | Valenzin | |
| 5,812,496 A | 9/1998 | Peck | |
| 6,007,105 A | 12/1999 | Dietle et al. | |
| 6,064,909 A | 5/2000 | Barkley et al. | |
| 6,128,394 A | 10/2000 | Hayakawa | |
| 6,188,773 B1* | 2/2001 | Murata | H04R 1/005 |
| | | | 128/201.19 |
| 6,486,398 B1* | 11/2002 | McCulloch | B60R 16/0222 |
| | | | 174/539 |
| 6,785,395 B1 | 8/2004 | Ameson | |
| 6,899,794 B1 | 5/2005 | Yamada | |
| 6,932,187 B2 | 8/2005 | Banter et al. | |
| 7,245,733 B2 | 7/2007 | Saltykov | |
| 7,499,561 B2 | 3/2009 | Hanses et al. | |
| 7,577,345 B2 | 8/2009 | Tei et al. | |
| 7,707,877 B2 | 5/2010 | Nishizu et al. | |
| 7,876,919 B2* | 1/2011 | Ram | H04R 1/086 |
| | | | 381/322 |
| 7,894,621 B2 | 2/2011 | Jensen | |
| 8,055,003 B2 | 11/2011 | Mittleman et al. | |
| 8,059,490 B2 | 11/2011 | Rapps et al. | |
| 8,112,130 B2 | 2/2012 | Mittleman et al. | |
| 8,135,149 B2 | 3/2012 | Yoshida et al. | |
| 8,157,048 B2 | 4/2012 | Banter et al. | |
| 8,170,266 B2 | 5/2012 | Hopkinson et al. | |
| 8,175,321 B2 | 5/2012 | Bryant et al. | |
| 8,185,166 B2 | 5/2012 | Weber et al. | |
| 8,220,142 B2 | 7/2012 | Lim | |
| 8,229,153 B2 | 7/2012 | Mittleman et al. | |
| 8,272,517 B2 | 9/2012 | Horie et al. | |
| 8,416,089 B1 | 4/2013 | Clary | |
| 8,624,384 B1* | 1/2014 | Minervini | B81B 7/0061 |
| | | | 257/704 |
| 8,644,530 B2 | 2/2014 | Soininen et al. | |
| 8,670,586 B1 | 3/2014 | Boyle et al. | |
| 8,687,828 B2 | 4/2014 | Otani et al. | |
| 8,724,841 B2 | 5/2014 | Bright et al. | |
| 8,792,665 B2 | 7/2014 | Lin | |
| 8,803,745 B2 | 8/2014 | Dabov | |
| 8,811,634 B2 | 8/2014 | Kaplan et al. | |
| 8,883,289 B2 | 11/2014 | Tsao et al. | |
| 8,923,528 B2 | 12/2014 | Arche | |
| 8,939,252 B2 | 1/2015 | Sanborn | |
| 8,942,401 B2 | 1/2015 | Murayama | |
| 8,965,030 B2 | 2/2015 | Aase | |
| 8,986,802 B2 | 3/2015 | Karube et al. | |
| 9,038,773 B2 | 5/2015 | Banter | |
| 9,171,535 B2 | 10/2015 | Abe et al. | |
| 9,226,076 B2 | 12/2015 | Lippert et al. | |
| 9,363,589 B2 | 6/2016 | Lippert et al. | |
| 2004/0029530 A1 | 2/2004 | Noguchi et al. | |
| 2005/0134473 A1 | 6/2005 | Jang et al. | |
| 2006/0045301 A1 | 3/2006 | Jakubaitis | |
| 2006/0198547 A1 | 9/2006 | Hampton | |
| 2007/0003081 A1 | 1/2007 | Ram et al. | |
| 2007/0035865 A1 | 2/2007 | Ohashi | |
| 2007/0113964 A1* | 5/2007 | Crawford | H04R 1/086 |
| | | | 156/249 |
| 2007/0263878 A1 | 11/2007 | Yu | |
| 2008/0149417 A1 | 6/2008 | Dinh | |
| 2009/0230487 A1 | 9/2009 | Saitoh et al. | |
| 2011/0013799 A1 | 1/2011 | Fang et al. | |
| 2011/0255728 A1 | 10/2011 | Abe et al. | |
| 2012/0177239 A1 | 7/2012 | Lee | |
| 2013/0170109 A1 | 7/2013 | Cohen et al. | |
| 2013/0223656 A1* | 8/2013 | Iuchi | H04R 1/023 |
| | | | 381/189 |
| 2013/0287213 A1 | 10/2013 | Sekiyama | |
| 2013/0296994 A1 | 11/2013 | Vaishya | |
| 2014/0044297 A1 | 2/2014 | Loeppert et al. | |
| 2014/0064546 A1 | 3/2014 | Szczech | |
| 2014/0083296 A1 | 3/2014 | Sanders | |
| 2014/0093095 A1 | 4/2014 | Slotte et al. | |
| 2014/0219646 A1 | 8/2014 | Hooton et al. | |
| 2014/0254849 A1 | 9/2014 | Abe et al. | |
| 2015/0016648 A1 | 1/2015 | Kazemzadeh et al. | |
| 2015/0146905 A1 | 5/2015 | Abe et al. | |
| 2015/0163572 A1 | 6/2015 | Weiss et al. | |
| 2015/0237431 A1 | 8/2015 | Jeziorek et al. | |
| 2015/0304767 A1 | 10/2015 | Mori | |
| 2015/0319534 A1 | 11/2015 | Lippert et al. | |
| 2016/0212526 A1 | 7/2016 | Salvatti et al. | |

FOREIGN PATENT DOCUMENTS

| | | |
|---|---|---|
| EP | 1998591 | 12/2008 |
| JP | 2004312156 | 11/2004 |
| JP | 2011188191 | 9/2011 |
| JP | 2013115549 | 6/2013 |
| WO | WO 2015/047378 | 4/2015 |

OTHER PUBLICATIONS

Consumerist, "Cellphone Battery Designed to Fail at First Drop of Water?" Consumerist, Sep. 22, 2007 (Sep. 22, 2007), XP055199652, Retrieved from the Internet: URL:http://consumerist.com/2007/09/22/cellphone-battery-designed-to-fail-at-first-drop-of-water/ [retrieved on Jul. 2, 2015], 4 pages.

The Gadget Show, "What to do when gadgets get wet," Retrieved from the Internet: URL:http://gadgetshow.channel5.com/gadget-show/blog/what-to-do-when-gadgets-get-wet [retrieved on Apr. 9, 2014], p. 2, paragraph 1, 2 pages.

* cited by examiner

LIQUID-RESISTANT ACOUSTIC DEVICE GASKET AND MEMBRANE ASSEMBLIES

FIELD

The described embodiments relate generally to acoustic devices. More particularly, the present embodiments relate to acoustic devices having a membrane.

BACKGROUND

Electronic devices (such as phones, media players, computing devices, and so on) may include acoustic devices (such as microphones or speakers) in order to provide the capability to produce or record sound. The electronic devices may provide some kind of exposure (such as an opening in a housing) to an external environment in order for sound waves to pass to and/or from an acoustic device in order for the acoustic device to function. However, such exposure may make the electronic device and/or the acoustic device vulnerable to contaminants from the external environment such as liquid, dust, and so on.

SUMMARY

The present disclosure relates to liquid-resistant acoustic device gasket and membrane assemblies. A liquid-resistant acoustic assembly for an electronic device may include an acoustic device positioned in a housing, a gasket compressed between the acoustic device and the housing, and a liquid-resistant membrane. The liquid-resistant membrane may be isolated from a non-uniform compressive distribution resulting from compression of the gasket. In some implementations, the liquid-resistant membrane may be positioned such that it may be uncompressed by compression of the gasket or compressed by a different compressive force than the gasket. For example, the liquid-resistant membrane may not be positioned between the gasket and the acoustic device, may be separated from the gasket, may be mounted to a shelf of the gasket or within a gap defined by the gasket, mounted to a stiffener positioned within the gasket, and so on.

In various embodiments, a liquid-resistant acoustic assembly for an electronic device may include an acoustic device positioned in a housing; a gasket positioned between the housing and the acoustic device and having a portion subject to a first compressive force; and a liquid-resistant membrane, disposed between the housing and the acoustic device, that is subject to a second compressive force (which may be zero) different from the first compressive force.

In some examples, the liquid-resistant membrane may not be positioned between the gasket and the acoustic device. In some implementations, a surface of the gasket facing the housing may include a protrusion that extends from the surface and contacts the housing, and the liquid-resistant membrane may be disposed within an area encircled by the protrusion. In various implementations, the liquid-resistant membrane may occupy a gap defined by the gasket.

In various examples, the gasket may define a space and the liquid-resistant acoustic assembly may further include a ring positioned within the space and having a higher elastic modulus than the gasket. The liquid-resistant membrane may be bonded to the ring.

In some examples, the liquid-resistant acoustic assembly may further include a circuit substrate coupled to the acoustic device wherein the liquid-resistant membrane is adhesively bonded to the circuit substrate.

In some embodiments, a liquid-resistant acoustic assembly for an electronic device may include an acoustic device positioned in a housing, a bracket coupled to the acoustic device, a seal compressed by the bracket toward an internal surface of the housing, and a membrane located between the housing and the acoustic device that resists passage of liquid but allows passage of air and is uncompressed by the compression of the seal.

In various examples, the membrane may be located within a space defined by the seal. In some examples, the seal may include a shelf facing the internal surface of the housing and the membrane may be mounted to the shelf.

In various examples, the liquid-resistant acoustic assembly may further include a stiffener (which may be formed of plastic, polyimide, metal, steel, or stainless steel) mounted within the space. The membrane may be mounted to a first surface of the stiffener that faces the internal surface of the housing or a second surface of the stiffener that faces the acoustic device.

In various embodiments, a liquid-resistant acoustic assembly for an electronic device may include an acoustic device, a gasket that is compressed between a housing of the electronic device and the acoustic device resulting in a non-uniform compressive distribution, and a liquid-resistant membrane disposed between the housing and the acoustic device. The liquid-resistant membrane may be isolated from the non-uniform compressive distribution.

In some examples, the liquid-resistant acoustic assembly may further include a rigid plate positioned between the gasket and the liquid-resistant membrane. The rigid plate may uniformly transfer force from the compressible material to the liquid-resistant membrane, thereby resulting in the liquid-resistant membrane being isolated from the non-uniform compressive distribution.

In various examples, the non-uniform compressive distribution may be due to an uneven surface of the gasket. In some examples, the gasket may resist passage of liquid into an internal volume of the electronic device beyond the acoustic device, and the liquid-resistant membrane may resist passage of the liquid into the acoustic device.

In some embodiments, a liquid-resistant acoustic assembly for an electronic device may include an acoustic device disposed within a housing, a gasket positioned between the acoustic device and the housing, a liquid-resistant membrane disposed between the gasket and the acoustic device, and a rigid member positioned between at least part of the gasket and the liquid-resistant membrane that prevents non-uniform distribution of compressive force between the gasket and the liquid-resistant membrane.

In various examples, the rigid member may be disposed on a surface of the gasket or a surface of the liquid-resistant membrane. In some examples, the rigid member may be positioned inside the gasket.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

Some electronic devices may include a gasket, seal, or other compressible material that is compressed between the acoustic device and a housing. Such a gasket may block liquid and/or other contaminants from entering an internal volume of the electronic device. Various electronic devices may include a membrane that resists the passage of liquid but allows the passage of air and sound waves. Such a membrane may block liquid and/or other contaminants from entering the acoustic device.

The present disclosure relates to liquid-resistant acoustic device gasket and membrane assemblies. A liquid-resistant acoustic assembly for an electronic device may include a housing, an acoustic device positioned in the housing, a gasket compressed between the acoustic device and the housing, and a liquid-resistant membrane disposed between the housing and the acoustic device. The liquid-resistant membrane may not be compressed by the compression of the gasket.

The liquid-resistant membrane may isolated from a non-uniform compressive distribution resulting from compression of the gasket. In some implementations, the liquid-resistant membrane may be disposed such that it may be uncompressed by compression of the gasket or compressed by a different compressive force than compression of the gasket. For example, the liquid-resistant membrane may not be positioned between the gasket and the acoustic device, may be separated from the gasket by a stiffener, may be mounted to a shelf of the gasket or within a gap defined by the gasket, mounted to a stiffener positioned within the gasket, and so on.

These and other embodiments are discussed below with reference to FIGS. 1-10. However, those skilled in the art will readily appreciate that the detailed description given herein with respect to these Figures is for explanatory purposes only and should not be construed as limiting.

Figure 1:
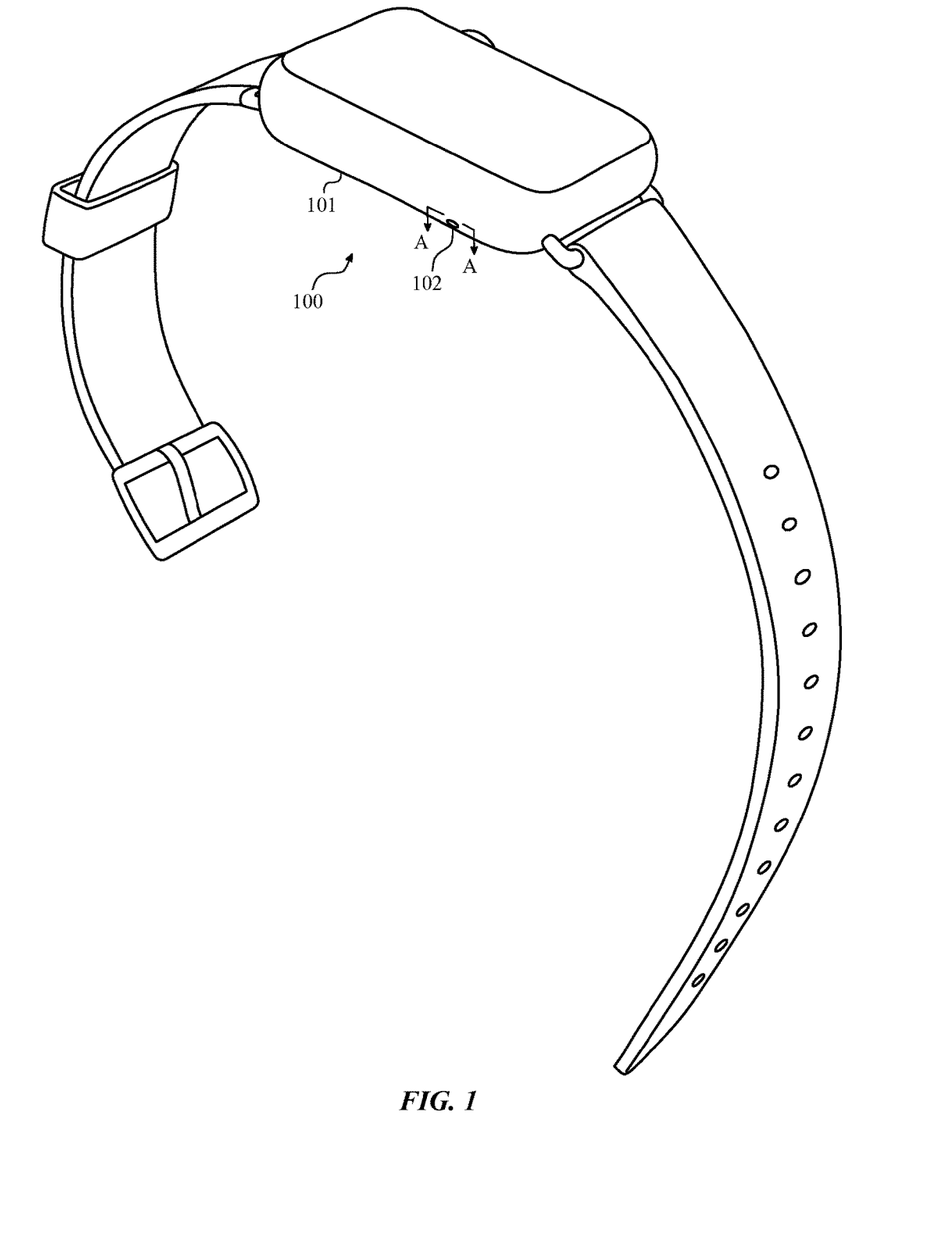
FIG. 1 shows an electronic device that may include a liquid-resistant acoustic assembly.

FIG. 1 shows an electronic device 100. The electronic device 100 may be a portable electronic device, such as a wearable electronic device. The electronic device 100 may include various internal components, including, for example, one or more acoustic devices and circuitry for controlling and/or driving the one or more acoustic devices. The electronic device may also include non-transitory storage media, processing units (which may execute instructions stored in the storage media to perform various functions such as receiving and/or producing sound waves using an acoustic device), communication components, input/output components, and so on.

Because the electronic device 100 may be subjected to various environmental conditions, it may be advantageous that the electronic device be at least partially water or liquid resistant. In some cases, the internal components of the electronic device 100 may be susceptible to damage and/or impaired operation if liquid enters the housing 101 of the electronic device 100. As shown in FIG. 1, the housing includes an acoustic opening 102 formed in an exterior surface of the housing 101. While the acoustic opening 102 may be necessary for the transmission of sound into or out of an internal acoustic device, it may serve as a potential ingress point for water or other liquid.

It may be advantageous that the electronic device 100 include a moisture/liquid barrier to prevent or reduce liquid ingress at the acoustic opening 102. One potential solution is to use a liquid-resistant acoustic assembly that includes a water-resistant membrane or other similar element to reduce or prevent an ingress of liquid. In general, it may be beneficial that the water-resistant membrane be able to transmit acoustic signals (e.g., audible sounds) while also blocking water or other liquids.

Figure 2A:
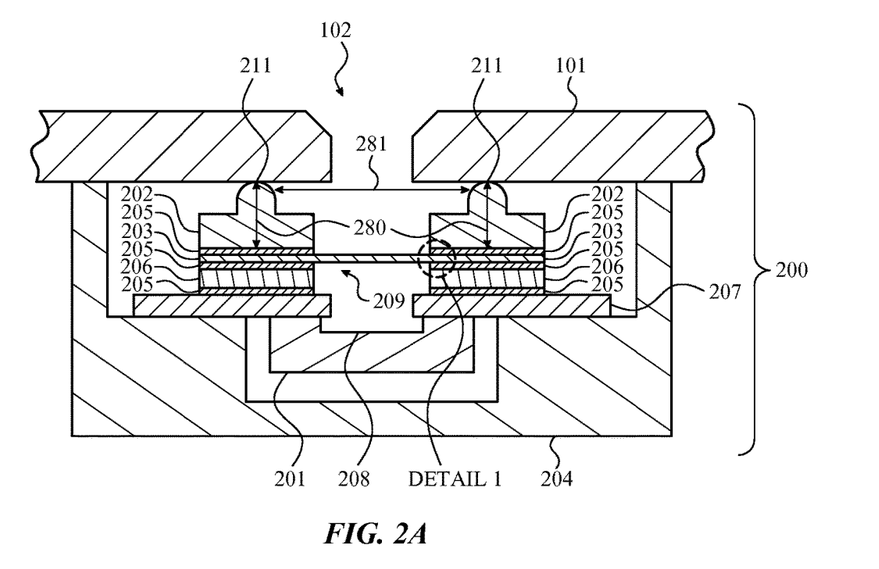
FIG. 2A shows a cross-sectional view of the electronic device of FIG. 1 illustrating an example liquid-resistant acoustic assembly, taken along A-A of FIG. 1.

An example of such a liquid-resistant acoustic assembly 200 is shown in FIG. 2A. The liquid-resistant acoustic assembly 200 may include an acoustic device 201 positioned in the housing 101 and a gasket 202 (or seal, compressible material such as silicone, and so on) that is compressed toward an internal surface of the housing 101 by bracket 204. The gasket 202 may form a liquid barrier that resists liquid ingress around the acoustic device 201. Compression of the gasket 202 by the bracket 204 may ensure that the gasket 202 forms an adequate seal against liquid ingress. The liquid-resistant acoustic assembly 200 may also include a liquid-resistant (or waterproof) membrane 203 (e.g., a membrane that resists passage of liquid such as water but allows passage of air and/or sound waves such as a membrane formed of expanded polytetrafluoroethylene). The liquid-resistant membrane 203 may resist liquid ingress into the acoustic device 201.

The liquid-resistant membrane 203 may be tightly stretched in order to resist liquid ingress while still allowing for the passage of air and/or sound waves. Compression by the bracket 204 may adversely impact the liquid-resistant membrane 203, such as by causing the liquid-resistant membrane 203 to wrinkle or deform. As such, the liquid-resistant acoustic assembly 200 may include one or more stiffeners 206 (such as rings, rigid plates, rigid members, and so on) that may uniformly transfer compressive force from the bracket 204 to the liquid-resistant membrane 203 (and/or otherwise at least partially shield the liquid-resistant membrane 203 from the compressive force) in order to reduce and/or mitigate some wrinkling and/or deformation of the liquid-resistant membrane 203 without reducing the compressive force of the bracket 204.

In this example, the acoustic device 201 may be a speaker. However, it should be understood that this is an example. In various implementations the acoustic device 201 may be a microphone, speaker, microelectromechanical microphone, microelectromechanical speaker, and so on without departing from the scope of the present disclosure.

The liquid-resistant acoustic assembly 200 will now be described in more detail. The bracket 204 may be coupled to internal surface of the housing 101 around the opening 102. The bracket 204 may be coupled to a flex circuit 207 or other circuit substrate, to which the acoustic device 201 is attached within an internal volume inside the housing 101. The gasket 202 may be positioned between the acoustic device 201 and the housing 101 such that force exerted by the bracket 204 on the flex circuit 207 is transferred to compress the gasket 202. Thus, the flex circuit 207 may have a structural function in the liquid-resistant acoustic assembly 200 and may also function to electrically connect the acoustic device 201 to other electronic components of the electronic device 100 (not shown). Compression of the gasket 202 may allow the gasket 202 to resist passage of liquid into the internal volume of the electronic device 100 beyond the acoustic device 201, functioning as a water or other liquid barrier.

The gasket 202 may be coupled to the flex circuit 207, and thus the acoustic device 201, via one or more components. These components may include one or more layers of adhesive 205 (such as pressure sensitive adhesive), the stiffener 206, and the liquid-resistant membrane 203.

The stiffener 206 may function to more uniformly transfer force from the bracket 204 to the gasket 202. This may allow for more uniform compression of the gasket 202 by the bracket 204 compared to acoustic assemblies that do not utilize such stiffeners 206.

The acoustic device 201 may include an acoustic port 208 and the liquid-resistant acoustic assembly 200 may define an acoustic volume 209 through which acoustic waves may travel to and/or from the acoustic port 208. The liquid-resistant membrane 203 may resist passage of liquid into a portion of the acoustic volume 209 and thus the acoustic port 208 while allowing passage of air and/or sound waves.

Although the stiffener 206 may more uniformly transfer force from the bracket 204 to the gasket 202, the stiffener may not mitigate problems caused by force transferred by the gasket 202 to the liquid-resistant membrane 203. For example, the gasket 202 may have an uneven surface. As shown, the surface of the gasket 202 facing the internal surface of the housing 101 may include protrusions 211 that project from the surface, which may form a contact region that contacts the internal surface of the housing 101. This uneven surface due to the protrusions 211 may cause compression 280 of the gasket 202 resulting from the force exerted by the bracket 204 to have a non-uniform compression distribution through at least a portion the gasket 202. As a result, the gasket 202 may transfer a non-uniform compressive force to the portions of the liquid-resistant membrane 203 positioned between the gasket 202 and the acoustic device 201 (such as portions positioned outside an area defined by a perimeter 281 between the protrusions 211), compressing the liquid-resistant membrane 203 and subjecting the liquid-resistant membrane 203 to the same compressive force as the gasket 202. This situation may result in poor acoustic performance and/or poor sealing against liquids for the liquid-resistant acoustic assembly 200.

Figure 2B:
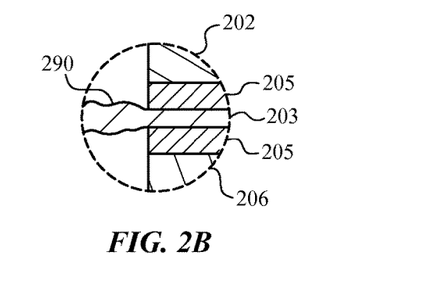
FIG. 2B shows a detail view of the indicated portion of FIG. 2A.

FIG. 2B shows a detail view of the indicated portion of FIG. 2A. As shown, the non-uniform compression distribution through the gasket 202 deforms the gasket 202. This deformation causes the gasket 202 to transfer non-uniform compressive force to non-uniformly compress the liquid-resistant membrane 203. As a result, the liquid-resistant membrane 203 is squeezed by the compressive force and wrinkles 290 may form on surfaces of the liquid-resistant membrane 203. These wrinkles 290 and the squeezing of the liquid-resistant membrane 203 may adversely affect acoustic performance of the liquid-resistant acoustic assembly 200.

These acoustic problems resulting from compression of the liquid-resistant membrane 203 by the same compressive force as the gasket 202 could be mitigated by weakening the force exerted by the bracket 204 to compress the gasket 202. However, weakening the compression may reduce the effectiveness of the gasket 202 as a liquid seal. An improved configuration may allow for compression of the gasket 202 for functioning as a liquid seal without allowing compression of the gasket 202 to affect the acoustic properties of the liquid-resistant membrane 203.

Figure 3:
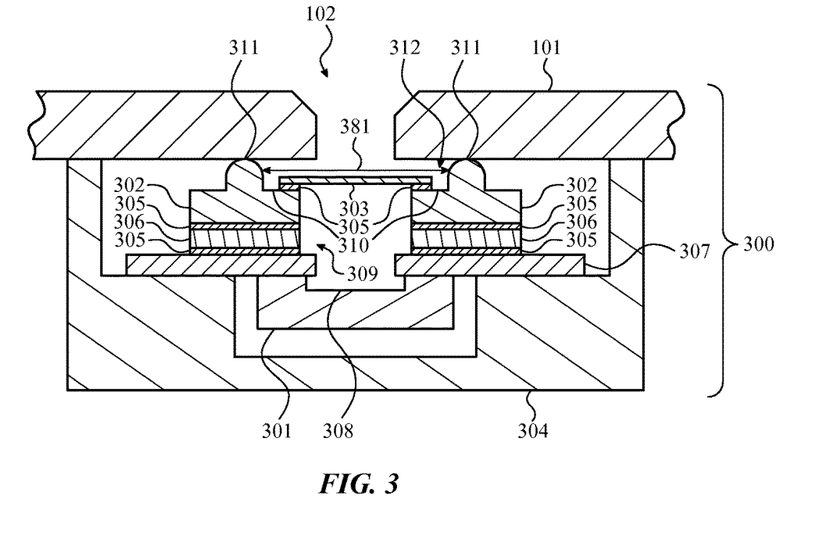
FIGS. 3-9 show cross-sectional views of additional examples of liquid-resistant acoustic assemblies.

FIG. 3 shows a second example liquid-resistant acoustic assembly 300 in accordance with the present disclosure. Similar to the liquid-resistant acoustic assembly 200 of FIG. 2, the liquid-resistant acoustic assembly 300 may include a bracket 304 coupled to internal surface of the housing 101 around the opening 102 and an acoustic device 301 (with acoustic port 308 connected to acoustic volume 309). Also similar to the liquid-resistant acoustic assembly 200 of FIG. 2, the liquid-resistant acoustic assembly 300 may include flex circuit 307, gasket 302, adhesive 305, stiffener 306, and liquid-resistant membrane 303. Unlike the liquid-resistant acoustic assembly 200 of FIG. 2, the liquid-resistant membrane 303 in the liquid-resistant acoustic assembly 300 is not positioned between the gasket 302 and the acoustic device 301.

Instead, the liquid-resistant membrane 303 is mounted via adhesive 305 to a shelf 310 of the gasket 302 facing the internal surface of the housing 101, occupying a gap 312 defined by the gasket 302. Described another way, the liquid-resistant membrane 303 may be encircled by the protrusions 311. As the liquid-resistant membrane 303 is within an area defined by a perimeter 381 between the protrusions 311 (e.g., encircled by the protrusions 311), and not between the gasket 302 and the acoustic device 301, compression of the gasket 302 may not compress the liquid-resistant membrane 303 with the same (or any) compressive force. Thus, the compression of the gasket 302 may not cause squeezing or wrinkling of the liquid-resistant membrane 303.

If the gasket 302 is compressed with a first force, the liquid-resistant membrane 303 may be compressed by a second compressive force. The second compressive force may be lesser than the first compressive force, such as where the second compressive force is zero (e.g., the liquid-resistant membrane 303 is uncompressed by compression of the gasket 302). In some cases, the liquid-resistant membrane 303 is free of (and/or isolated from) the non-uniform compressive distribution of force resulting from compression of the gasket 302.

Figure 4:
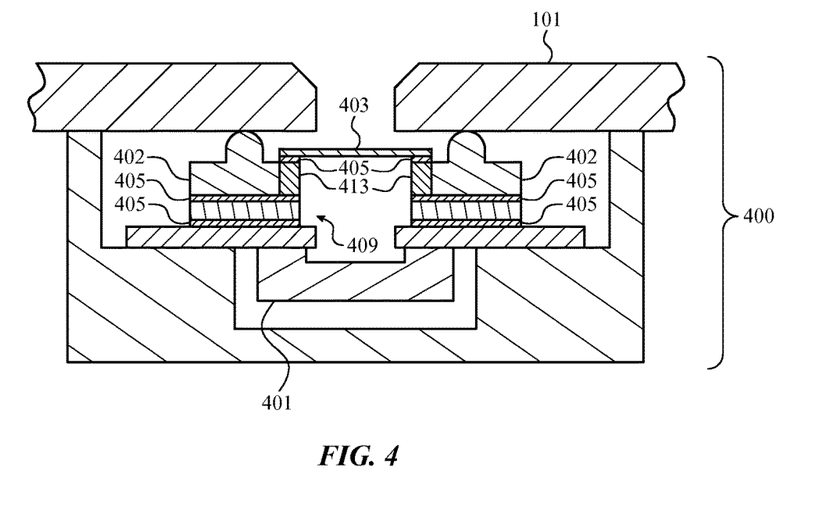

As compared to the liquid-resistant acoustic assembly 300 of FIG. 3, the liquid-resistant acoustic assembly 400 of FIG. 4 includes a ring 413 (or stiffener, rigid plate, rigid member, and so on) mounted to and/or otherwise positioned in a space defined by the gasket 402. The ring 413 has a first surface facing the internal surface of the housing 101 and a second surface facing the acoustic device 401. In the liquid-resistant acoustic assembly 400, the liquid-resistant membrane 403 is mounted (such as by being adhesively bonded by adhesive 405) to the first surface of the ring 413 facing the internal surface of the housing 101. The ring 413 may prevent non-uniform distribution of compressive force between the gasket 402 and the liquid-resistant membrane 403. Thus, the liquid-resistant membrane 403 is mounted within the space defined by the gasket 402. Described another way, the liquid-resistant membrane 403 may be encircled by the gasket 402. As a result, the liquid-resistant membrane 403 may be uncompressed and/or otherwise not affected by compression of the gasket 402.

The ring 413 may be formed of a material with a higher elastic modulus than the gasket 402. For example, the gasket 402 may be a material such as silicone whereas the ring 413 may be a material such as plastic, polyimide, metal, steel, or stainless steel. Due to the higher elastic modulus of the ring 413, the ring 413 may not compress with compression of the gasket 402. Thus, compression of the gasket 402 will not compress the liquid-resistant membrane 403. In some cases, the ring 413 and the gasket 402 may be formed together by a process such as injection molding.

Further, as the ring 413 occupies a portion of the acoustic volume 409, there is less volume in the acoustic volume 409 for any liquid that breaches the liquid-resistant membrane 403. This lesser volume available for liquid that does breach the liquid-resistant membrane 403 may improve the ability of the liquid-resistant acoustic assembly 400 to recover from such a breach.

Figure 5:
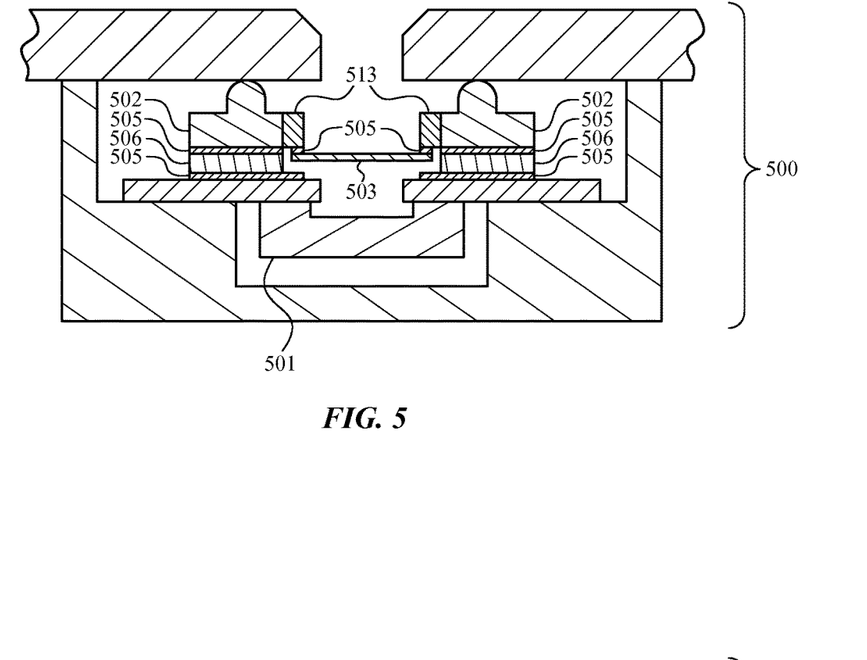

FIG. 5 illustrates another example where a liquid-resistant membrane 503 may be encircled by a gasket 502. As compared to the liquid-resistant acoustic assembly 400 of FIG. 4, the liquid-resistant acoustic assembly 500 of FIG. 5 mounts the liquid-resistant membrane 503 to the second surface of the ring 513 facing the acoustic device 501. As shown, the adhesive 505 between the stiffener 506 and the gasket 502 may have different dimensions than the adhesive 405 between the stiffener 406 and the gasket 402 in the liquid-resistant acoustic assembly 400 of FIG. 4 to form gaps allowing room for the liquid-resistant membrane 503.

In some examples of a liquid-resistant acoustic assembly, the liquid-resistant membrane may be positioned between the gasket and the acoustic device while still being free of and/or isolated from the non-uniform compressive distribution resulting from compression of the gasket. For example, the liquid-resistant acoustic assembly 600 of FIG. 6 may include a stiffener 614 (or ring, rigid plate, rigid member, and so on) positioned between the gasket 602 and the liquid-resistant membrane 603. Due to the rigidity or inflexibility of the stiffener 614, the stiffener 614 may receive non-uniform compressive force transferred by the gasket 602 and distribute the compressive force uniformly to the liquid-resistant membrane 603. In other words, the stiffener 614 may prevent non-uniform distribution of compressive force between the gasket 602 and the liquid-resistant membrane 603. As a result, the liquid-resistant membrane 603 may be subjected to uniform compressive force while being free of (and/or isolated from) the non-uniform compressive distribution that results from compression of the gasket 602.

Figure 6:
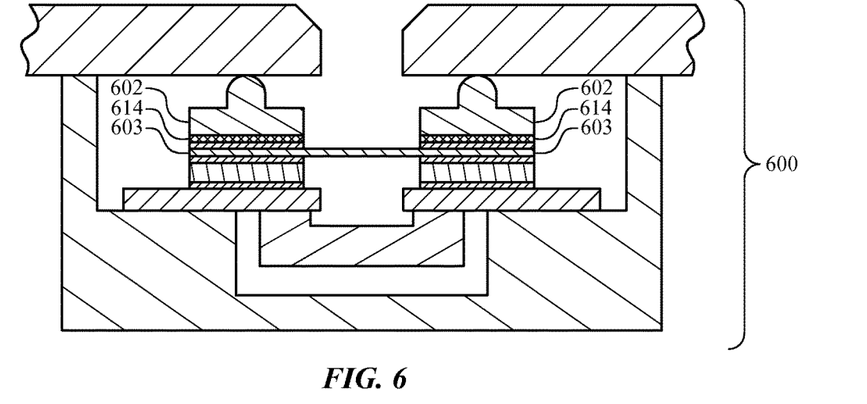

As shown, the stiffener 614 (which may be formed together with the gasket 602 by a process such as injection molding) may be disposed on a surface of the gasket 602. However, it is understood that this is an example. In other examples, the stiffener 614 may be formed within the gasket 602, disposed on a surface of the liquid-resistant membrane 603, and so on.

Figure 7:
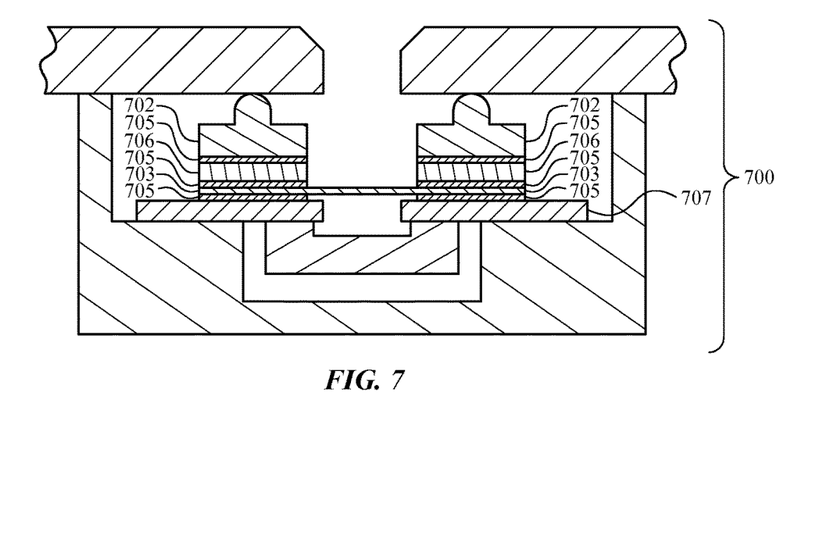

Similarly, as compared to the liquid-resistant acoustic assembly 200 of FIG. 2, the stiffener 706 of the liquid-resistant acoustic assembly 700 of FIG. 7 is positioned between the gasket 702 and the liquid-resistant membrane 703. As a result, the stiffener 706 may receive non-uniform compressive force transferred by the gasket 702 and may uniformly transfer such compressive force to the liquid-resistant membrane 703 without utilizing a different stiffener and/or disposing the stiffener 706 on a surface of the gasket 702 or the liquid-resistant membrane 703.

As shown, the liquid-resistant acoustic assembly 700 of FIG. 7 mounts the liquid-resistant membrane 703 to the flex circuit 707 using the adhesive 705. However, it is understood that this is an example. In some examples, the liquid-resistant membrane 703 may be laminated and/or otherwise formed as part of the flex circuit 707. In some examples the flex circuit 707 may be a laminate formed of a circuit connect adhesively attached to a stiffening substrate, such as stainless steel. In such an example, the liquid-resistant membrane 703 may be laminated with the adhesive of the flex circuit 707 that attaches the circuit connect to the stiffening substrate.

Further, in some examples the gasket may be positioned other than between the acoustic device and the housing in order to prevent compression of the gasket from compressing the liquid-resistant membrane. For example, as compared to the liquid-resistant acoustic assembly 200 of FIG. 2, the liquid-resistant acoustic assembly 800 of FIG. 8 positions the gasket 802 between the bracket 804 and the flex circuit 807 and mounts the liquid-resistant membrane 803 to the internal surface of the housing 101 via the adhesive 805. As a result, compression of the gasket 802 is not transferred to the liquid-resistant membrane 803 and may be blocked and/or otherwise minimized by stiffening portions of the flex circuit 807 and/or the stiffener 806.

Figure 8:
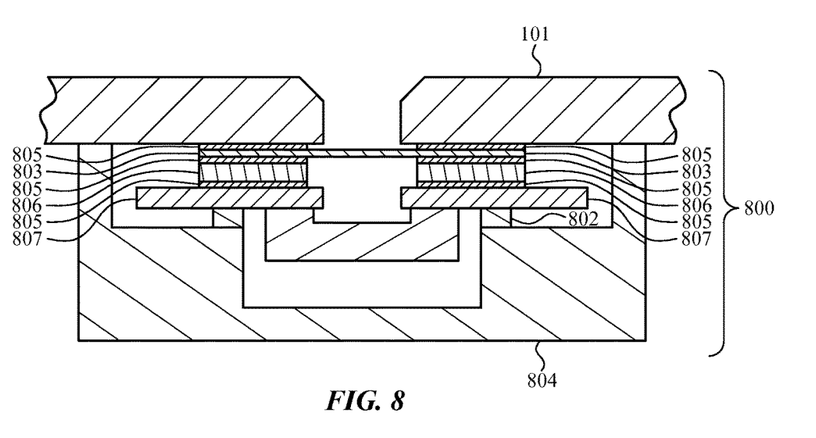

Further, due to the placement of the gasket 802, the gasket 802 may adequately seal when compressed without protrusions such as the protrusions 211 of the liquid-resistant acoustic assembly 200 of FIG. 2. Thus, the gasket 802 may be formed with even surfaces. This may allow the gasket 802 to be formed using processes other than injection or other molding, such as examples where the gasket 802 is formed by die cutting.

Figure 9:
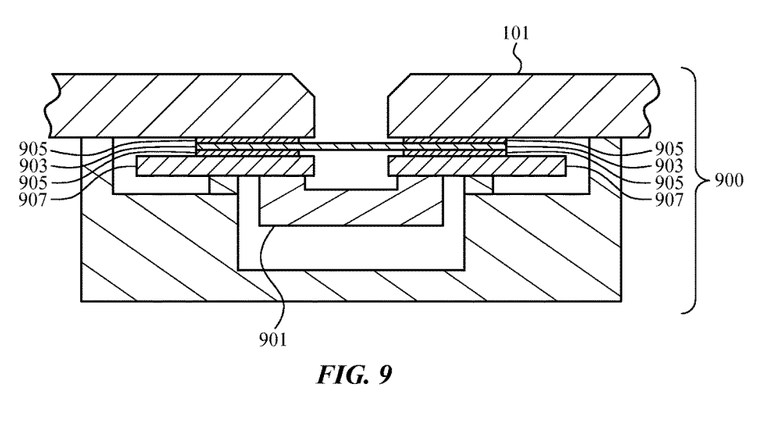

As compared to the liquid-resistant acoustic assembly 800 of FIG. 8, the liquid-resistant acoustic assembly 900 of FIG. 9 omits the stiffener 806 and the layer of adhesive 805 that coupled the stiffener 806 to the flex circuit 807. Thus, the liquid-resistant membrane 903 may be directly coupled to the flex circuit 907 (with or without the adhesive 905) without positioning a stiffener between the acoustic device 901 and the housing 101. This may allow for the liquid-resistant acoustic assembly 900 to have a stack-up of smaller dimensions than other examples, such as the liquid-resistant acoustic assembly 800 of FIG. 8.

Figure 10:
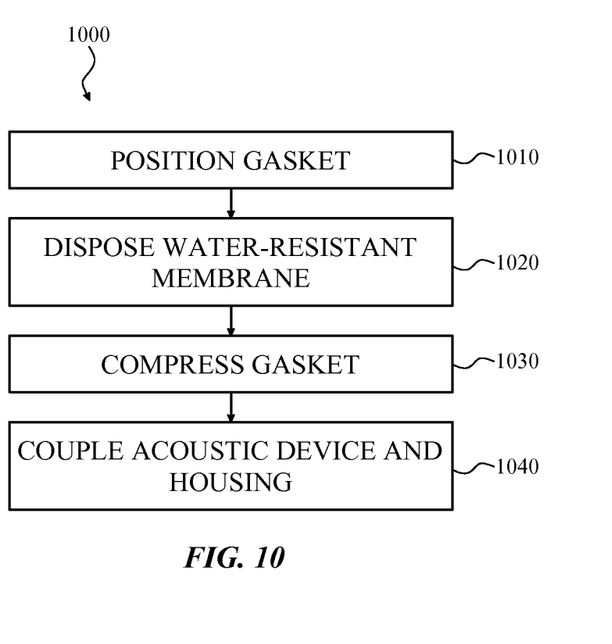
FIG. 10 shows a flow chart illustrating a method for constructing a liquid-resistant acoustic assembly. This method may construct the liquid-resistant acoustic assemblies of FIGS. 2A-9.

FIG. 10 shows a flow chart illustrating a method 1000 for constructing a liquid-resistant acoustic assembly. This method 1000 may construct one or more of the liquid-resistant acoustic assemblies of FIGS. 2A-9.

At 1010, a gasket (or seal, compressible material such as silicone, and so on) may be positioned in an acoustic assembly. The gasket may be positioned between an internal surface of a housing of an electronic device and an acoustic device positioned within the housing.

At 1020, a liquid-resistant membrane (and/or any other membrane that resists passage of liquid but allows passage of air and/or sound waves) is disposed on the liquid-resistant acoustic assembly. The liquid-resistant membrane may be positioned between the internal surface of the housing and the acoustic device.

At 1030, the gasket may be compressed. The gasket may be compressed by a bracket towards the internal surface of the housing. Due to the disposition of the liquid-resistant membrane, the liquid-resistant membrane may be free of (isolated from) a non-uniform compressive distribution resulting from compression of the gasket. In some implementations, the liquid-resistant membrane may be uncompressed by compression of the gasket or compressed by a different force than compression of the gasket.

At 1040, the acoustic device may be coupled to the housing. The acoustic device may be coupled to the housing via the bracket, to which the acoustic device may be coupled via a flex circuit and/or other structure. The acoustic device may also be coupled to the housing via the gasket and/or one or more other components such as adhesives, stiffeners, the liquid-resistant membrane, and so on.

Although the example method 1000 is illustrated and described as including particular operations performed in a particular order, it should be understood that this is an example. In various implementations, various orders of the same, similar, and/or different operations may be performed without departing from the scope of the present disclosure.

For example, the method 1000 is illustrated and described presenting compressing the gasket and coupling the acoustic device to the housing as separate linear operations. However, it is understood that this is an example presented for clarity. In various implementations, operations such as compressing the gasket and coupling the acoustic device to the housing may be performed simultaneously.

Although the electronic device 100 is illustrated in FIG. 1 as a portable electronic device, it should be understood that this is an example. In various implementations, the electronic device may be any device that includes an acoustic device without departing from the scope of the present disclosure. Examples of such devices include laptop computing devices, desktop computing devices, tablet computing devices, mobile computing devices, digital media players, displays, smart phones, cellular telephones, wearable devices, items of apparel, and so on.

As described above and illustrated in the accompanying figures, the present disclosure relates to liquid-resistant acoustic device gasket and membrane assemblies. A liquid-resistant acoustic assembly for an electronic device may include a housing, an acoustic device positioned in the housing, a gasket compressed between the acoustic device and the housing, and a liquid-resistant membrane disposed between the housing and the acoustic device. The liquid-resistant membrane may not be compressed by the compression of the gasket. The liquid-resistant membrane may be free of (isolated from) a non-uniform compressive distribution resulting from compression of the gasket. In some implementations, the liquid-resistant membrane may be disposed such that it may be uncompressed by compression of the gasket or compressed by a different compressive force than compression of the gasket. For example, the liquid-resistant membrane may not be positioned between the gasket and the acoustic device, may be separated from the gasket by a stiffener, may be mounted to a shelf of the gasket or within a gap defined by the gasket, mounted to a stiffener positioned within the gasket, and so on.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A liquid-resistant acoustic assembly for an electronic device, comprising:
   an acoustic device positioned in a housing;
   a gasket positioned between the housing and the acoustic device and having a portion subject to a first compressive force, wherein the gasket has an inner surface; and
   a liquid-resistant membrane having an outer edge, disposed between the housing and the acoustic device, that is subject to a second compressive force different from the first compressive force, wherein the liquid-resistant membrane is separated from the gasket by a gap between the outer edge and the inner surface, and wherein the gap mechanically isolates the liquid-resistant membrane from the first compressive force.

2. The liquid-resistant acoustic assembly of claim 1, wherein the second compressive force is zero.

3. The liquid-resistant acoustic assembly of claim 1, wherein:
   a surface of the gasket facing the housing includes a protrusion that extends from the surface and contacts the housing; and
   the liquid-resistant membrane is disposed within an area encircled by the protrusion.

4. The liquid-resistant acoustic assembly of claim 1, wherein the liquid-resistant membrane is not positioned between the gasket and the acoustic device.

5. The liquid-resistant acoustic assembly of claim 1, wherein the liquid-resistant membrane occupies an opening defined by the gasket.

6. The liquid-resistant acoustic assembly of claim 1, wherein:
   the gasket defines a space; and the liquid-resistant acoustic assembly further comprises: a ring positioned within the space and having a higher elastic modulus than the gasket.

7. The liquid-resistant acoustic assembly of claim 6, wherein the liquid-resistant membrane is bonded to the ring.

8. The liquid-resistant acoustic assembly of claim 1, further comprising:
   a circuit substrate coupled to the acoustic device; wherein the liquid-resistant membrane is adhesively bonded to the circuit substrate.

9. A liquid-resistant acoustic assembly for an electronic device, comprising:
   an acoustic device positioned in a housing;
   a bracket coupled to the acoustic device;
   a seal compressed by the bracket toward an internal surface of the housing, wherein the seal has a first perimeter; and
   a membrane located between the housing and the acoustic device that resists passage of liquid but allows passage of air and is uncompressed by the compression of the seal, wherein the membrane has a second perimeter, and wherein the second perimeter is smaller than the first perimeter such that the membrane is mechanically isolated from the seal.

10. The liquid-resistant acoustic assembly of claim 9, wherein the membrane is located within a space defined by the seal.

11. The liquid-resistant acoustic assembly of claim 10, further comprising a stiffener mounted within the space.

12. The liquid-resistant acoustic assembly of claim 11, wherein the membrane is mounted to at least one of: a first surface of the stiffener that faces the internal surface of the housing; or a second surface of the stiffener that faces the acoustic device.

13. The liquid-resistant acoustic assembly of claim 11, wherein the stiffener comprises at least one of plastic, polyimide, metal, steel, or stainless steel.

14. The liquid-resistant acoustic assembly of claim 9, wherein:
   the seal includes a shelf facing the internal surface of the housing; and the membrane is mounted to the shelf.

15. A liquid-resistant acoustic assembly for an electronic device, comprising:
   an acoustic device;

a gasket that is compressed between a housing of the electronic device and the acoustic device, resulting in a non-uniform compressive distribution; and a liquid-resistant membrane disposed between the housing and the acoustic device; wherein the liquid-resistant membrane is isolated from the non-uniform compressive distribution, wherein the liquid-resistant membrane is separated from the gasket by a stiffener such that the liquid-resistant membrane does not contact the gasket.

16. The liquid-resistant acoustic assembly of claim 15, wherein the stiffener comprises a rigid plate positioned between the gasket and the liquid-resistant membrane.

17. The liquid-resistant acoustic assembly of claim 16, wherein the rigid plate uniformly transfers force from the gasket to the liquid-resistant membrane, thereby resulting in the liquid-resistant membrane being isolated from the non-uniform compressive distribution.

18. The liquid-resistant acoustic assembly of claim 15, wherein the non-uniform compressive distribution is due to an uneven surface of the gasket.

19. The liquid-resistant acoustic assembly of claim 15, wherein:

the gasket resists passage of liquid into an internal volume of the electronic device beyond the acoustic device; and the liquid-resistant membrane resists passage of the liquid into the acoustic device.

20. A liquid-resistant acoustic assembly for an electronic device, comprising:

an acoustic device disposed within a housing;

a gasket positioned between the acoustic device and the housing, wherein the gasket has an opening and an inner surface that surrounds the opening;

a liquid-resistant membrane disposed between the gasket and the acoustic device; and a ring-shaped rigid member positioned between at least part of the gasket and the liquid-resistant membrane that prevents non-uniform distribution of compressive force between the gasket and the liquid-resistant membrane, wherein the ring-shaped rigid member is located in the opening and mounted to the inner surface of the gasket, and wherein the liquid-resistant membrane is mounted to the ring-shaped rigid member.

* * * * *